United States Patent [19]
Ryan

[11] 3,949,228
[45] Apr. 6, 1976

[54] METHOD FOR CONTROLLING AN ELECTRON BEAM
[75] Inventor: Philip M. Ryan, Hopewell Junction, N.Y.
[73] Assignee: IBM Corporation, Armonk, N.Y.
[22] Filed: Sept. 9, 1974
[21] Appl. No.: 504,618

Related U.S. Application Data
[62] Division of Ser. No. 398,734, Sept. 19, 1973, Pat. No. 3,866,013.

[52] U.S. Cl. ...... 250/396 R; 219/121 EM; 250/398; 315/383
[51] Int. Cl.² .......................................... G21K 1/08
[58] Field of Search ........... 250/396, 397, 398, 492; 219/121 EM, 121 EB; 29/569; 315/10

[56] References Cited
UNITED STATES PATENTS
3,644,700   2/1972   Kruppa et al. ................ 219/121 EB

*Primary Examiner*—Davis L. Willis
*Attorney, Agent, or Firm*—Frank C. Leach, Jr.; T. E. Galanthay

[57] ABSTRACT

A square-shaped electron beam is stepped from one predetermined position to another in a line-by-line scan to form a desired pattern on each chip of a semiconductor wafer to which the beam is applied. At each of the predetermined positions, the beam is on, off, or on for a portion of the time period at which the beam is disposed at the predetermined position. The beam also can be offset both along its direction of movement and perpendicular thereto at each of the predetermined positions. Control of this movement of the beam is obtained through utilizing a memory with no change being made in the memory if the predetermined position at the next line does not have any change from the predetermined position at the line along which the beam is moving.

2 Claims, 3 Drawing Figures

METHOD FOR CONTROLLING AN ELECTRON BEAM

This is a division of application Ser. No. 398,734 filed Sept. 19, 1973, now U.S. Pat. No. 3,866,013.

In U.S. Pat. No. 3,644,700 to Kruppa et al, there is shown an apparatus for stepping a square-shaped electron beam in a substantially raster fashion over a predetermined area. In the aforesaid Kruppa et al patent, the beam is disposed at each of the predetermined positions for approximately 2 microseconds.

The present invention is an improvement of the aforesaid Kruppa et al patent in that the speed of movement of the electron beam is increased approximately one order of magnitude. Thus, the present invention significantly increases the speed of pattern writing of the chips of a semiconductor wafer by an electron beam.

The present invention causes this faster stepping of the electron beam to occur through utilizing a memory for the information to the blanking plates for the electron beam and to the electrostatic deflection plates for the beam in which the memory retains the same information for the corresponding predetermined position on the next line if there is no change in either the exposure or the electrostatic deflection of the beam. This results in information not having to be transmitted to the memory at the same rate as the electron beam is being stepped since pattern writing of a semiconductor chip usually results in many of the predetermined positions on adjacent lines being the same.

Accordingly, even though information could not be supplied from any presently available computer storage system to the memory at the same rate at which the beam is being stepped, the system of the present invention avoids this problem. The information in the memory is not changed if the corresponding position on the next line is to be treated in the same manner by the beam. Thus, this reduces the amount of information required to be supplied to the memory so that the beam can move faster than the information could be supplied from any presently available computer storage system to the memory.

The present invention also employs a buffer to store information that can be transmitted to the memory for a short period of time at a faster rate than information can be supplied to the buffer. However, the buffer also can become depleted or exhausted if many changes are required in the memory in a short period of time because of changes in the corresponding positions on adjacent lines.

When this occurs, a subroutine memory, which is separate from the computer stored information, becomes effective until the buffer is again ready to transmit more data to the memory. The subroutine memory updates the information in the memory, which supplies the signals for controlling the electron beam, when the buffer has become exhausted and is again being replenished.

In the apparatus of the aforesaid Kruppa et al patent, the beam was either on or off for the entire period of time that the beam was at each of the predetermined positons. However, it is believed that more precise pattern formation can be obtained in certain instances if the beam is on for only a portion of the entire period of time that it is at one of the predetermined positions.

For example, a metal in a semiconductor chip can have a different electron reflectivity than the semiconductor material of the chip. For example, if gold is disposed beneath one portion of the resist and silicon is the semiconductor material of the chip, the higher electron reflectivity of gold in comparison with silicon could cause overexposure of the resist, which is disposed over the gold, if the same beam exposure is applied to each portion of the resist. Therefore, by controlling the exposure of the beam when it is disposed over a metal having a higher electron reflectivity than silicon, for example, overexposure of the resist can be avoided.

When forming a pattern line having a width equal to two spots of the beam, for example, the exposure of the resist to the beam for two spots causes the width of the pattern line to be greater than twice the width of a pattern line produced by exposure to a single beam spot. To insure linear uniformity between pattern lines of different widths, reduction of the exposure of the beam when it is applied for more than one spot to produce a pattern line having a width greater than one beam spot can result in linear uniformity of the widths of pattern lines so that a pattern line having a width produced by two spots of the beam has a width equal to two spots of the beam rather than being wider.

The present invention satisfactorily solves this problem by causing the beam to be selectively turned on for either the entire period of time or for only a portion of the period of time that the beam is disposed at each of the predetermined positions. With the present invention, the portion of the time period for which the beam can be turned on during the disposition of the beam at each of the predetermined positions is the same for a particular line. That is, while each line can have a different portion of the time period for which the beam can be applied at each of the predetermined positions, this portion of the time period is constant for a particular line.

An object of this invention is to provide a method and apparatus for increasing the speed of positioning an electron beam in accordance with a desired pattern.

Another object of this invention is to provide a method and apparatus for controlling the exposure of an electron beam at each of a plurality of predetermined positions.

A further object of this invention is to provide a method and apparatus for updating a memory at a faster rate than can be obtained from a computer and a buffer.

The foregoing and other objects, features, and advantages of the invention will be apparent from the following more particular description of a preferred embodiment of the invention as illustrated in the accompanying drawings.

Figure 1:
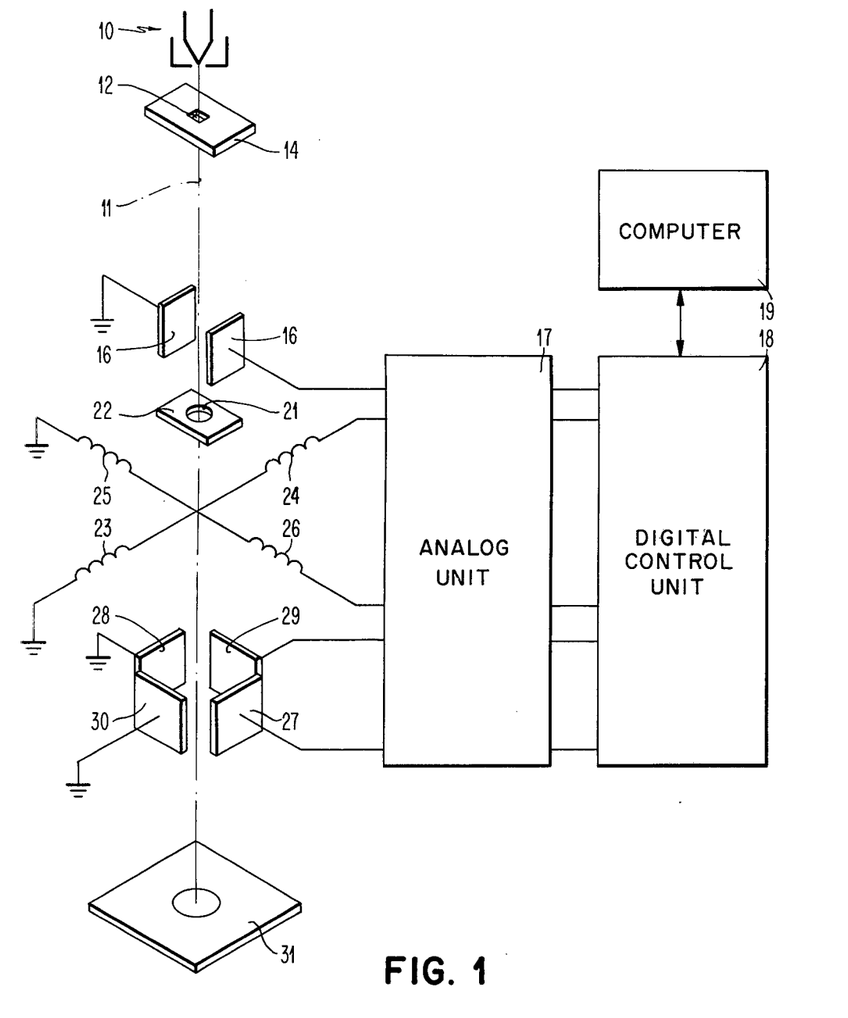
FIG. 1 is a schematic view showing the apparatus of the present invention for controlling the position of an electron beam.

Referring to the drawings and particularly FIG. 1, there is shown an electron gun 10 for producing a beam 11 of charged particles in the well-known manner. The electron beam 11 is passed through an aperture 12 in a plate 14 to shape the beam 11. The beam 11 is preferably square shaped and has a size equal to the minimum line width of the pattern that is to be formed.

The beam 11 passes between a pair of blanking plates 16, which determine when the beam is applied to the material and when the beam is blanked. The blanking plates 16 are controlled by an analog unit 17 from circuits, which form part of a digital control unit 18. The digital control unit 18 is connected to a computer 19, which is preferably an IBM 370 computer.

The beam 11 then passes through a circular aperture 21 in a plate 22. This controls the beam 11 so that only the charged particles passing through the centers of the lenses (not shown) are used so that a square-shaped spot without any distortion is produced.

The beam 11 is next directed through magnetic deflection coils 23, 24, 25, and 26. The magnetic deflection coils 23 and 24 control the deflection of the beam 11 in a horizontal or X direction while the magnetic deflection coils 25 and 26 control the deflection of the beam 11 in a vertical or Y direction. Accordingly, the coils 23–26 cooperate to move the beam 11 in a horizontal scan by appropriately deflecting the beam. While the beam 11 could be moved in a substantially raster fashion as shown and described in the aforesaid Kruppa et al patent, it is preferably moved in a back and forth scan so that the beam 11 moves in opposite directions along adjacent lines.

The beam 11 then passes between electrostatic deflection plates 27, 28, 29, and 30. The plates 27 and 28 cooperate to deflect the beam in a horizontal or X direction while the electrostatic deflection plates 29 and 30 cooperate to move the beam 11 in the vertical or Y direction. The plates 27–30 are employed to provide any desired offset of the beam 11 at each of the predetermined positions or spots to which it is moved.

The beam 11 is then applied to a target such as a semiconductor chip having resist that is exposed by the beam 11. The target is supported on a table 31. The table 31 is movable in X and Y directions as more particularly shown and described in the aforesaid Kruppa et al patent.

The beam 11 is moved through A, B and C cycles as shown and described in the aforesaid Kruppa et al patent. The system of the present invention is concerned with controlling the beam 11 during the B cycle when pattern writing of the chip occurs by exposing the resist.

Figure 2A:
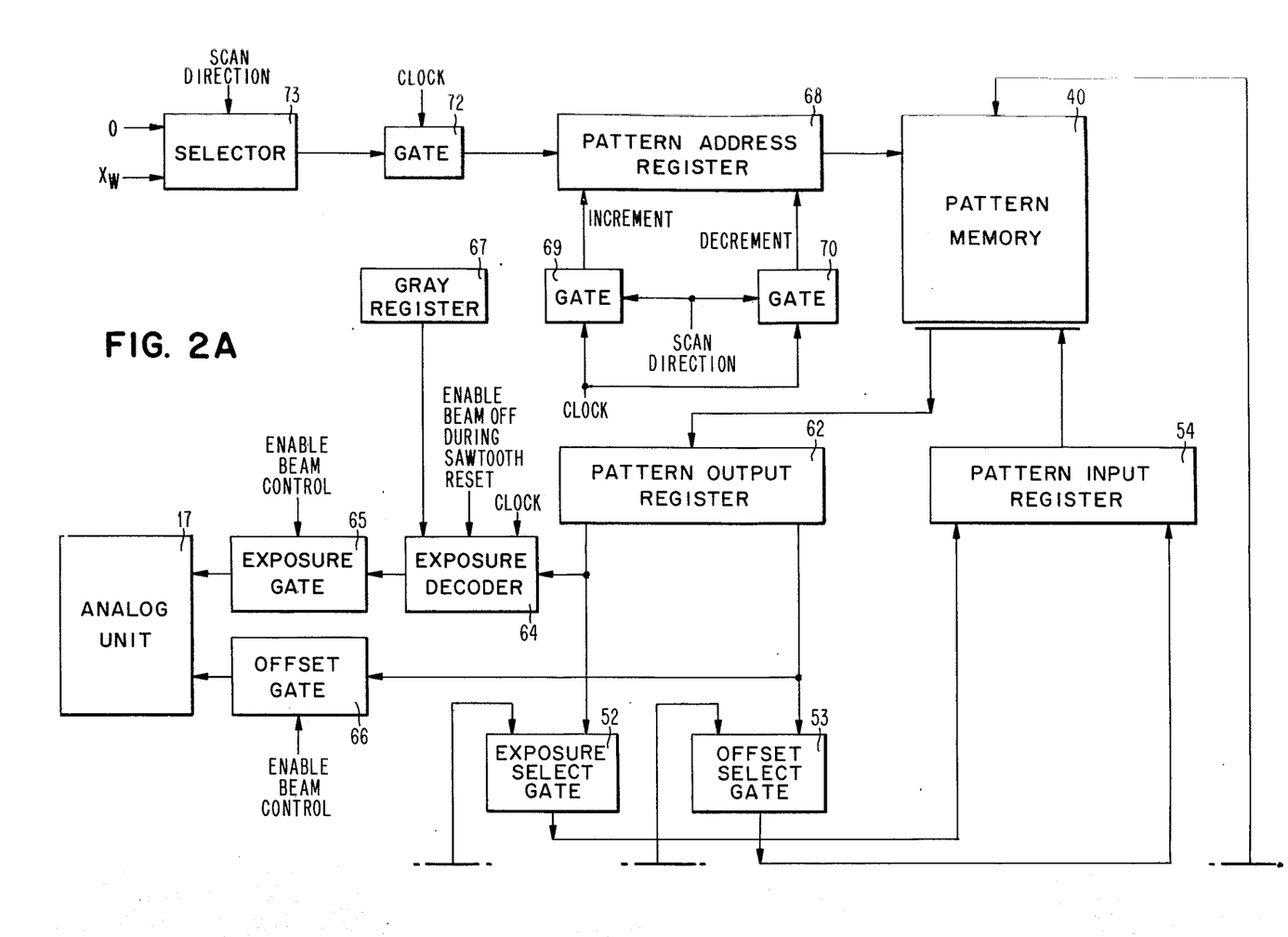
FIGS. 2A and 2B are a block diagram showing the manner in which the electron beam is controlled.

As shown in FIG. 2A, the digital control unit 18 includes a pattern memory 40, which has the number of words of data therein equal to or greater than the number of predetermined positions or spots to which the beam 11 is moved during its horizontal scan along a single line. That is, each of the predetermined positions or spots to which the beam 11 is moved during its movement in the X direction along a single line is correlated to one word of the pattern memory 40.

The pattern memory 40 is connected directly to a channel 41 (see FIG. 2B) of the computer 19 when a gate 42 is activated by an internal control latch identified as "ENABLE INITIAL LOAD." With activation of the gate 42, initial information can be supplied directly to the pattern memory 40 from the channel 41 of the computer 19. However, the initial writing of information into the pattern memory 40 normally occurs during an initial scan by the beam 11. That is, as the beam 11 scans in one direction, information is written in the pattern memory 40 for the scan in the opposite direction as no pattern writing of the chip occurs during the scan in the one direction.

Figure 2B:
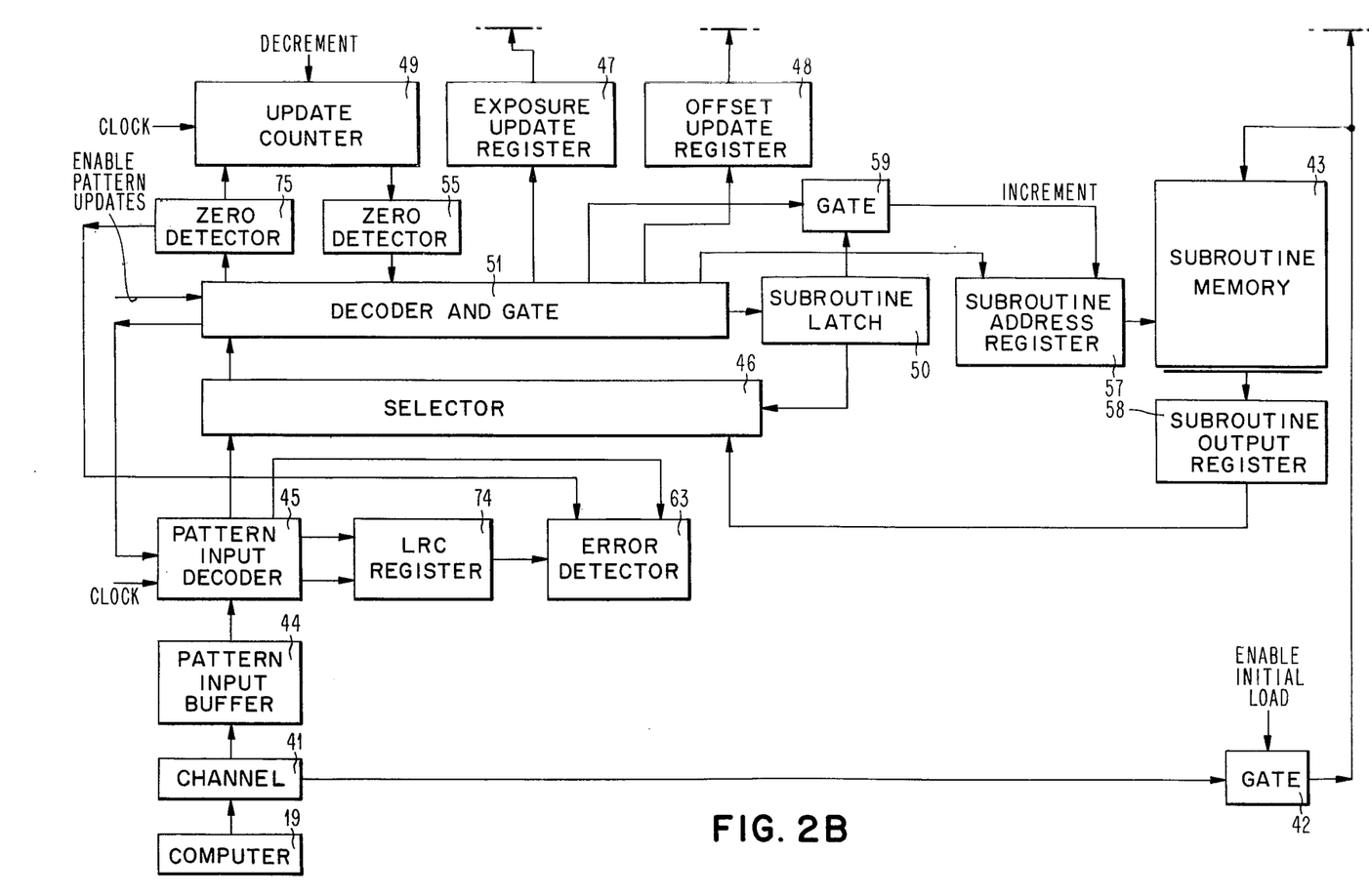

When the gate 42 is activated, information is supplied from the channel 41 of the computer 19 to a subroutine memory 43 (see FIG. 2B). All of the information to be stored in the subroutine memory 43 for pattern writing of the entire chip is supplied at this time to the subroutine memory 43. Upon completion of transmittal of information to the pattern memory 40 and the subroutine memory 43, a signal from the channel 41 of the computer 19 causes the internal control latch to close the gate 42.

Except for when the gate 42 is enabled, the pattern memory 40 receives its information from either the channel 41 of the computer 19 through a pattern input surge buffer 44 or from the subroutine memory 43. The subroutine memory 43 supplies data only when the need for updating the information in the memory 40 would exhaust the data in the pattern input buffer 44.

The pattern input buffer 44 transmits the information through a pattern input decoder 45 to a selector 46. The information from the pattern input buffer 44 is transmitted from the selector 46 to the pattern memory 40 through an exposure update register 47 and/or an offset update register 48 only when an update counter 49 is at zero and a subroutine latch 50 is not activated to allow information to be supplied from the subroutine memory 43. The subroutine latch 50 is connected to a decoder and gate 51 to receive the necessary signal therefrom when the subroutine latch 50 is to be activated to allow the information to be supplied from the subroutine memory 43.

When information is to be supplied to the pattern memory 40, information is transmitted from the selector 46 through the exposure data register 47 to an exposure select gate 52 (see FIG. 2A) and through the offset update register 48 to an offset select gate 53. The gates 52 and 53 are connected through a pattern input register 54 to the pattern memory 40.

The new information need only update either the exposure of the beam 11 or the offset of the beam 11. Of course, it can supply information for both. However, the update counter 49 (see FIG. 2B) goes to zero whenever updating of either exposure or offset is required and activates a zero detector 55, which then enables the selector 46 to transmit information to at least one of the registers 47 and 48.

The exposure update register 47, the offset update register 48, the update counter 49, the exposure select gate 52, the offset select gate 53, and the zero detector 55 are all inactivated through the decoder and gate 51 when an internal control latch identified as "ENABLE PATTERN UPDATES" is inactivated to prevent updating of information in the pattern memory 40 at desired times. Thus, when the gate 42 is activated, updating is prevented by the inactivation of the internal control latch through the decoder and gate 51, and this updating is prevented throughout the initial scan by the beam 11 after the gate 42 has been inactivated.

The exposure signal determines whether the beam 11 is maintained in an off condition for the entire time period at which the beam 11 is disposed at a predetermined position, an on condition for the entire time period at which the beam 11 is disposed at the predetermined position, or an on condition for a portion of the time period at which the beam 11 is disposed at the predetermined position. The time period from the time that the beam 11 reaches a predetermined position until the time that the beam 11 is at the next of the predetermined positions is divided into sixteen portions or ticks with the first fourteen portions or ticks being when exposure of the beam 11 can occur while the last two portions or ticks is when the beam 11 is stepped to the next predetermined position or spot. When the beam 11 is to be exposed for less than the total of the fourteen positions, exposure occurs so that the beam 11 completes its exposure at the time that the beam 11 is to be stepped to the next predetermined position. For example, if the beam 11 is to be exposed for only six portions or ticks, the beam 11 would be blanked for the first eight portions or ticks and then turned on for the next six portions or ticks.

The timing for these sixteen portions or ticks is obtained from an X' counter. Thus, the X' counter provides sixteen portions or ticks during each time period or spot interval.

The offset signal determines whether the beam 11 is offset and the amount of offset. It should be understood that the beam 11 is offset during the stepping of the beam 11 from one predetermined position to the next. This is during the last two ticks.

The data includes information for offset in both X and Y directions. The offset in the X direction is in a direction along which the beam 11 is moving while the Y direction is perpendicular thereto in the plane of the material to which the beam 11 is being applied.

The beam 11 can be offset in increments that either advance or retard the beam 11 in the direction in which it is moving with respect to the predetermined position to which it is moved and in increments that move the beam 11 to either side of the X direction in which it is moving. When the beam 11 is moving forwardly, a positive offset in the X direction is an advance of the beam 11 in the direction in which the beam 11 is moving while a negative offset retards the beam 11 in the direction in which it is moving. When the beam 11 is moving rearwardly, a positive offset in the X direction retards the beam 11 while a negative offset in the X direction advances the beam 11. Thus, the positive offset and negative offset are always in the same direction irrespective of which direction the beam 11 is moving. A positive offset in the Y direction always offsets the beam 11 above its line of movement while a negative offset in the Y direction always offsets the beam 11 below its line of movement.

The update counter 49 receives a clock signal from the X' counter each time that the beam 11 is moved to the next of the predetermined positions or spots. When the update counter 49 is not inactivated through the decoder and gate 51 being inactivated, the update counter 49 is decremented one count during each stepping of the beam 11.

When the update counter 49 goes to zero due to being decremented, the zero detector 55 enables update information to be supplied from the selector 46. The selector 46 transmits the information from the pattern input buffer 44 unless the subroutine latch 50 is activated.

The subroutine latch 50 is activated initially from the decoder and gate 51 with this occurring when the zero detector 55 produces its signal to indicate that the update counter 49 is at zero. The information from the pattern input buffer 44 through the selector 46 to the decoder and gate 51 includes an address for transmittal to a subroutine address register 57 as well as the data to cause the subroutine latch 50 to be activated when the update counter 49 goes to zero. This data selects a particular address in the subroutine memory 43 from which information is to be supplied through a subroutine output register 58 to the selector 46 for updating the exposure update register 47 and/or the offset update register 48 and the update counter 49.

The information transmitted from the subroutine memory 43 upon the initial activation of the subroutine latch 50 includes data to determine whether the subroutine latch 50 remains activated. If it does, then the next time that the zero detector 55 is activated due to the update counter 49 going to zero, the data again is transmitted from the subroutine memory 43 to the selector 46 rather than from the pattern input buffer 44.

When the zero detector 55 again produces a signal due to the update counter 49 going to zero with the subroutine latch 50 activated, a gate 59 is activated because of the subroutine latch 50 already being activated and the zero detector 55 producing a signal. The activation of the gate 59 causes incrementing of the subroutine address register 57. The incrementing of the subroutine address register 57 addresses the next address in the subroutine memory 43 to cause the information at this address in the subroutine memory 43 to be supplied through the subroutine output register 58 to the selector 46 from which the data is transmitted to the exposure update register 47 and/or the offset update register 48 and the update counter 49.

The subroutine memory 43 is continuously addressed to receive information therefrom with each activation of the zero detector 55 by incrementing the addresss through the gate 59 being opened until the data from the subroutine memory 43 does not include activation of the subroutine latch 50. When this does not occur, the next activation of the zero detector 55 results in information being supplied from the pattern input buffer 44 to the selector 46 with this information either supplying data from the pattern input buffer 44 to the exposure update register 47 and/or the offset update register 48 and the update counter 49 or activating the subroutine latch 50 through the decoder and gate 51 and selecting another address in the subroutine address register 57 to cause data to be supplied from the subroutine memory 43. The activation of the subroutine latch 50 with a completely different address in the subroutine memory 43 being accessed is done when it is not desired to obtain the data from the next address in the subroutine memory 43 from the prior one as would occur through incrementing the address by the gate 59 being opened.

As previously mentioned, the information can be supplied to the pattern memory 40 through the pattern input register 54 (see FIG. 2A) only when the select gates 52 and 53 are opened. Even though the select gates 52 and 53 receive information from the exposure update register 47 and/or the offset update register 48 for transmittal to the pattern input register 54, they open to transmit this information only after there is also a signal from a pattern output register 62. This insures that the line in the pattern memory 40 receiving the new information has already transmitted its stored information to the pattern output register 62.

If the information in the exposure update register 47 and/or the offset update register 48 is zero, then the information for exposure and/or offset is transmitted from the pattern output register 62 through the exposure select gate 52 and/or the offset select gate 53 to the pattern input register 54. This zero in the register 47 or 48 when there is no change for the same spot in the next line.

At the time of reading out the information from the pattern memory 40, a parity check is performed. If there should be an error, the beam 11 is turned off by an error detector 63 (see FIG. 2B) to which a signal is transmitted due to the parity check error. Similarly, a validity check is made to determine if the new information from the pattern input register 54 is correct. If not, a signal is transmitted to the error detector 63 so as to turn off the beam 11 and to the computer 19 so that the computer 19 can initiate an error recovery sequence.

The exposure information from the pattern output register 62 is transmitted through an exposure detector 64 (see FIG. 2A) and an exposure gate 65 to the analog unit 17. At the same time, the offset information is supplied from the pattern output register 62 to the analog unit 17 through an offset gate 66.

If either the exposure decoder 64 or the exposure gate 65 is inactivated, no signal can be transmitted to turn on the beam 11. If the offset gate 66 is turned off, then no information concerning offset can be transmitted to the analog unit 17.

The exposure decoder 64 is turned off by an internal control latch, identified as "ENABLE BEAM OFF DURING SAWTOOTH RESET," when the beam 11 is being stepped to the next predetermined position. Thus, this forces the beam 11 to be off during stepping of the beam 11. It should be understood that the state of this latch is constant during any given line.

While the exposure detector 64 can transmit a signal to turn the beam 11 on when the internal control latch does not have the exposure decoder 64 turned off, the data from the pattern output register 62 determines whether the exposure decoder 64 is turned on or remains off when the appropriate clock signal from the X' counter is received at the exposure decoder 64. If the beam 11 is to be turned on for the entire period of time, the data from the pattern output register 62 indicates this so that the exposure decoder 64 is turned on as soon as stepping of the beam 11 is completed. If the beam 11 is to be turned on for only a portion of the period of time when the beam 11 is at a particular predetermined position, a gray register 67 is activated by the data from the pattern output register 62 so that the exposure decoder 64 is turned on for only the portion of the time that the beam 11 is to be applied through cooperation with the clock signal from the X' counter.

Each of the gates 65 and 66 is connected to an internal control latch identified as "ENABLE BEAM CONTROL." When this latch is turned on, the output of the exposure decoder 64 and the offset information from the pattern output register 62 is transmitted to the analog unit 17. When this latch is turned off, no exposure or offset information is transmitted to the analog unit 17.

The ENABLE PATTERN UPDATES latch and ENABLE BEAM CONTROL latch are independent. This permits beam control information to be sent to the analog unit 17 without requiring updates to be made in the pattern memory 40. This also permits the pattern memory 40 to be updated without simultaneously causing beam control information to be sent to the analog unit 17.

Normally, the ENABLE BEAM CONTROL latch is off to inactivate the gates 65 and 66 in the first scan of the B cycle when the pattern memory 40 is being updated through the pattern input buffer 44. The gates 65 and 66 are inactivated by the ENABLE BEAM CONTROL latch prior to the gate 42 being opened by its internal control latch and remain in this condition until activated after the first scan of the B cycle.

As the beam 11 is moved in its forward and backward scans, the pattern memory 40 is addressed from a pattern address register 68. As the beam 11 moves in one direction, preferably forward, the address in the pattern address register 68 is incremented each time that the beam 11 is moved to the next predetermined position. When the beam 11 moves in the opposite direction, the address in the pattern address 68 is decremented each time that the beam 11 is moved to the next predetermined position.

A gate 69, which receives a clock signal from the X' counter, causes incrementing of the pattern address register 68 during each stepping of the beam 11 in the forward scan with the scan direction being indicated by a signal from a Y counter. Thus, this arrangement insures that the pattern address register 68 causes each of the words in the pattern memory 40 be to addressed in sequence in an ascending order during scan in one direction, preferably from left to right of a chip of a semiconductor wafer on the table 31, for example.

When the beam 11 has completed its forward scan and retrace has ended so that backward scan is to start, the Y counter supplies a signal to the gate 69 and a gate 70 to inactivate the gate 69 and enable activation of the gate 70 whenever a clock signal from the X' counter is received at the gate 70. The opening of the gate 70 causes the pattern address register 68 to be decremented each time that the beam 11 steps in the backward (right to left) scan from one predetermined position to the next. This causes the pattern memory 40 to be addressed in the opposite direction to that in which it was addressed during the movement of the beam 11 in the forward scan. Accordingly, the information written in the pattern memory 40 always corresponds to the spot on the next line to be scanned. Of course, if the beam 11 were to be moved in a substantially raster fashion so as to move only in the forward scan, for example, then the pattern memory 40 would always be addressed in the same direction whereby only one of the gates 69 or 70 would be employed to cause only incrementing or decrementing, depending on which direction access to the pattern memory 40 was had, during each clock signal from the X' counter.

During retrace, a gate 72 is opened by a clock signal from an R counter to enable either 0 (zero), which represents the first count in the forward scan and the top address in the pattern address register 68, or $X_w$, which represents the last count in the forward scan and the bottom address in the pattern address register 68, to be supplied to the pattern address register 68. The Y counter also is connected to a selector 73 to supply the scan direction to cause selection of either 0 (zero) or $X_w$ prior to the gate 72 being opened during retrace.

At this time, the signal from the Y counter is opposite to that which will be supplied to the gates 69 and 70 at the end of retrace. Thus, when a forward scan has been completed, the signal from the Y counter results in 0 being selected during retrace after a forward scan for gating through the gate 72 to the pattern address register 68 and results in $X_w$ being selected for transmitting through the gate 72 to the pattern address register 68 when backward scan has been completed and retrace is occurring. Thus, this enables the pattern memory 40 to be addressed at successively higher addresses during forward scan and at successively lower addresses during backward scan.

There also is an X counter employed to count each spot to which the beam 11 moves. The X counter can count from 0 to 4095 as can the Y counter, which counts each line along which the beam 11 moves. The X counter actually counts only to $X_w$ and the Y counter actually counts only to $Y_w$, which represents the number of lines in the B cycle. The X counter, the Y counter, the X' counter, the R counter, and other counters can be driven from an oscillator in the manner more particularly shown and described in the aforesaid Kruppa et al patent. These counters are the clock for the entire system.

At the beginning of each line, a longitudinal redundancy check (LRC) register 74 (see FIG. 2B) is set at all ones. As each byte of data is taken from the pattern input buffer 44 to be decoded by the pattern decoder 45, it is exclusive-OR'd with the contents of the longitudinal redundancy check register 74 with the result inverted and then written into the register 74. When the end-of-line code from the pattern input buffer 44 is encountered, the bits therefrom, when exclusive-OR'd into the register 74 with the result inverted, should produce a zero result.

The error detector 63 determines whether the output from the longitudinal redundancy check register 74 is a zero at this time due to also receiving a signal from the pattern decoder 45 at the time when the bits from the end-of-line code are exclusive-OR'd into the longitudinal redundancy check register 74. If the output from the longitudinal redundancy check register 74 is zero, then the next line can be scanned by the beam 11 at the end of retrace.

If the output from the longitudinal redundancy check register 74 is not zero, the error detector 63 causes the beam 11 to be turned off by turning off the ENABLE BEAM CONTROL latch. It is not necessary to again turn on the beam 11 for the line that has been scanned although all of the update information must again be passed through the selector 46. If the longitudinal redundancy check register 74 has an output of zero, then the ENABLE BEAM CONTROL latch is allowed to remain on.

The error detector 63 also receives the output of the pattern decoder 45 for each update of the pattern memory 40. If the output of the pattern decoder 45 is invalid, the error detector 63 causes turning off of the beam 11 by turning off the ENABLE BEAM CONTROL latch.

A zero detector 75, which is connected to the error detector 63 and is disabled by the same internal control latch as controls the zero detector 55, senses the data supplied from the selector 46 to the update counter 49. If this data has a zero therein as determined by the zero detector 75, the error detector 63 disables the beam 11 by turning off the ENABLE BEAM CONTROL latch.

The error detector 63 also receives a signal when there is a parity error during transmittal of data from the pattern memory 40 or an error during writing of new data in the pattern memory 40. The error detector 63 disables the beam 11 whenever it detects an error during read of or write into the pattern memory 40.

Accordingly, the error detector 63 senses a plurality of different errors. These include the error due to a 0 being supplied to the update counter 49, an error at the end of any line being scanned, an error during read of the information in any line of the pattern memory 40, an error during write of any line in the pattern memory 40, and an error in the information from the pattern decoder 45 for updating the pattern memory 40. Any of these errors results in the error detector 63 causing the beam 11 to be disabled by turning off the ENABLE BEAM CONTROL latch.

Considering the operation of the present invention, the gate 42 is opened by the ENABLE INITIAL LOAD latch to enable data to be supplied to the subroutine memory 43. In some instances, initial information also may be supplied to the pattern memory 40 from the channel 41 of the computer 19, but the initial information is normally supplied to the memory 40 from the pattern input buffer 44 during a scan by the beam 11 across the chip prior to pattern writing.

When the information supplied to the subroutine memory 43 and the pattern memory 40 has been completed, the internal control latch is reset from the channel 41 of the computer 19 to close the gate 42. After this, the internal control latch, which has been inactivated to disable the exposure update rgister 47, the offset data register 48, the update counter 49, the select gates 52 and 53, and the zero detectors 55 and 75 through the decoder and gate 51, is activated to enable data to be transmitted to the pattern memory 40 from the selector 46. The gates 65 and 66 normally remain closed by their internal control latch until the first scan of the B cycle has been completed.

The first scan by the beam 11 during the B cycle occurs after the internal control latch enables information to be supplied from the selector 46 through the decoder and gate 51. During this scanning, the pattern memory 40 is receiving information for the next line to be scanned by the beam 11.

After the pattern memory 40 has the data for the line to be scanned, the information from the pattern memory 40 is obtained for each spot to which the beam 11 is stepped. When backward scan is occurring, the pattern address register 68 is decremented by the gate 70 being opened. After reading out the information from the pattern memory 40 for transmittal to the analog unit 17 through the pattern output register 62 for a particular predetermined position or spot, the gates 52 and 53 enable the information in the exposure update register 47 and the offset update register 48 to be transmitted through the pattern input register 54 to the pattern memory 40 if there is to be updating due to a change for the same spot in the next line.

Whenever the update counter 49 goes to zero as detected by the zero detector 55, new data is supplied to the exposure update register 47 and/or the offset update register 48 and the update counter 49 from either the pattern input buffer 44 or the subroutine memory 43. This is determined by whether the subroutine latch 50 is activated or not. If the subroutine latch 50 is activated, then the information comes from the subroutine memory 43 through the subroutine output register 58. Otherwise, the information comes from the pattern input buffer 44.

At the completion of beam scan in each direction, access is had to the pattern address register 68 during retrace through the gate 72 to select the correct address for the start of the next scan, and the gate 69 or 70 is opened at the end of the retrace. Then, the pattern memory 40 is addressed in the opposite direction from that to which it was addressed in the prior scan.

As the beam 11 is stepped to each of the predetermined positions, the amount of exposure, if any, of the beam 11 is obtained from the pattern memory 40 as is any offset of the beam 11. In this manner, the resist is exposed by the beam 11 to produce the desired pattern in the chip.

It should be understood that the form of the update commands, which comprise the information transmitted from the computer 19 to the pattern input decoder 45, must be chosen both to enhance the speed of decode by the pattern input decoder 45 and to minimize the volume of data necesssary to produce all sequences of updates. At the same time, the update commands must conform to the width of the data path through the channel 41 of the computer 19.

Any suitable form of update commands may be employed as long as the foregoing requirements for transmitting the information from the computer 19 to the pattern input decoder 45 are met. However, the preferred update commands are one byte (eight bits) of data, two bytes (sixteen bits) of data, or three bytes (twenty-four bits) of data depending on the amount of information required to be transmitted with there being three different groups of two bytes of data and one group of each of the one byte and three bytes of data.

When using the preferred update commands, the update counter 49 is twelve bits wide and has a range of 1 to 4080. However, the update counter 49 is normally restricted to a value no greater than $X_{tc}$.

The update counter 49 is divided into four low-order bits and eight high-order bits with the four low-order bits giving a range of 1 to 15 spots or predetermined positions of the beam 11 and the eight high-order bits giving a range of 16 to 4080 spots or predetermined positions of the beam 11 in steps of sixteen. Thus, the update counter 49 receives either four bits or eight bits depending on the number of predetermined positions or spots of the beam 11 to which the update counter 49 is to be updated by the update command. It should be understood that intermediate update counts between 17 and 4095, not in steps of sixteen, must be obtained with two update commands.

With the group of update commands having a width of one byte of data, there are four possible states, represented by the first four bits of the byte of data, to which the exposure update register 47 is set. These consist of no change in exposure of the beam 11, change exposure of the beam 11 to off, change exposure of the beam 11 to on, or change exposure of the beam 11 to a portion of the time period at which the beam 11 is disposed at the predetermined position.

The last four bits of this update command of one byte width is a four-bit count for the four low-order bits of the update counter 49. It should be understood that the offset update register 48 is set to zero so that there is no change. Thus, the form of each of these update commands is aaaa nnnn where aaaa specifies the bit configuration to be inserted in the exposure update register 47 and nnnn is the four-bit count to be inserted in the update counter 49.

A second group of update commands has a width of two bytes of data. This group of update commands sets the exposure update register 47 at one of its four possible states, places a four bit count in the four low-order bits of the update counter 49, and sets the offset update register 48 with the second byte (last eight bits) of the update command. The data supplied to the offset update register 48 can cause offset of the beam 11 in the X direction, the Y direction, or both. Thus, the form of these update commands is aaaa nnnnn bbbbbbbb where aaaa specifies the bit configuration to be inserted in the exposure update register 47, nnnn is the four-bit count to be placed in the update counter 49, and bbbbbbbb are the data to be placed in the offset update register 48.

Another group of update commands also has a width of two bytes of data. However, these update commands do not supply any information to the offset update register 48 as the register 48 is set to zero.

Instead, the first four bits of these update commands indicate that the update count is to be placed in the update counter 49 in the eight high-order bits. The next 4 bits set the exposure update register 47 to one of its four possible states, and the last 8 bits are supplied to the update counter 49. The form of these update commands in cccc aaaa nnnnnnnn where cccc is the signal that the update counter 49 is to receive an 8-bit count, aaaa specifies the bit configuration to be inserted in the exposure update register 47, and nnnnnnnn is the eight-bit count to be inserted in the eight high-order bits of the update counter 49.

Another group of update commands has a width of three bytes of data. These update commands have the first 4 bits to indicate that the update counter 49 is to have eight bits inserted in its eight high-order bits with the next four bits setting the exposure update register 47 to one of its four possible states. The next eight bits (second byte) are placed in the update counter 49 to indicate the period of time that the offset update register 48, which is set by the last 8 bits, provides the same offset information.

Thus, the form of each of the update commands of this group is cccc aaaa nnnnnnnn bbbbbbbb where cccc is the signal that the update counter 49 is to receive an eight-bit count, aaaa specifies the bit configuration to be inserted in the exposure update register 47, nnnnnnnn is the eight-bit count to be inserted in the eight high-order bits of the update counter 49, and bbbbbbbb are the date to be placed in the offset update register 48.

Another group of update commands also is employed with each of these having a width of two bytes. One of these update commands uses the first four bits to specify that the subroutine latch 50 is to be set and the last twelve bits to be inserted into the subroutine address register 57 to select a word of the subroutine memory 43. The form of this update command is dddd eeee eeeeeeee where dddd specifies that the subroutine latch 50 is to be set and eeee eeeeeeee is the address selected in the subroutine address register 57.

The other of the update commands of this group uses the first four bits to specify that end-of-line check is to be performed with the next four bits being compared to the four low-order bits of the Y counter during retrace and indicating an error if there is a mismatch through the error detector 63 while the last eight bits are exclusive-OR'd with the contents of the longitudinal redundancy check register 74 and the result inverted. The form of this update command is ffff gggg hhhhhhhh where ffff specifies the end-of-line check is to be performed, gggg is to be compared to the four low-order bits of the Y counter during retrace, and hhhhhhhh is the 8 bit data word to be exclusive-OR'd with the contents of the longitudinal redundancy check register 74.

While the present invention has described the beam 11 as being utilized to expose resist on a semiconductor chip, it should be understood that control of the charged particles could be employed for other than exposing the resist on the chip of the semiconductor. In addition to the other examples set forth in the aforesaid Kruppa et al patent, the beam also could be used for ion implantation, for example. Thus, the control of the beam 11 could determine where the ions were implanted without requiring a mask, for example.

While the beam 11 has been shown and described as a movable means controlled by the method and apparatus of the present invention, it should be understood that the method and apparatus of the present invention may be employed to control any other means movable in a line by line pattern to each of a plurality of predetermined positions along each of the lines. Thus, the present invention has utility whenever it is desired to take advantage of the correlation of at least one function of a movable means between corresponding positions of adjacent lines.

An advantage of this invention is that faster pattern writing by an electron beam is obtained. Another advantage of this inventon is that there is an error check during both read and write for each line and an error check at the end of each line. A further advantage of this invention is that it enables data to be transferred to the memory at times at a faster rate than the data is received by a surge buffer from which the information is transmitted. Still another advantage of this invention is that faster processing of chip patterns is produced. A still further advantage of this invention is that it reduces the data rate volume by at least one order of magnitude from that required without encoding. Yet another advantage of this invention is that it eliminates the peak data rate problem.

While the invention has been particularly shown and described with reference to a preferred embodiment thereof, it will be understood by those skilled in the art that various changes in form and details may be made therein without departing from the spirit and scope of the invention.

What is claimed is:

1. A method of controlling the exposure of a beam of charged particles at each of a plurality of predetermined positions to which the beam is moved and at which the beam is disposed for a time period including selecting whether the beam is turned on for the entire time period during which the beam is at the predetermined position, the beam is turned on for a selected portion of the time period during which the beam is at the predetermined position, or the beam is turned off for the entire time period during which the beam is at the predetermined position.

2. The method according to claim 1 including turning the beam on for the selected portion of the time period during which the beam is at the predetermined position so that the beam is moved to the next predetermined position when the selected portion of the time period expires.

* * * * *